US010854372B2

(12) United States Patent
Tsai et al.

(10) Patent No.: US 10,854,372 B2
(45) Date of Patent: *Dec. 1, 2020

(54) STACKED METAL INDUCTOR (71) Applicant: Intel IP Corporation, Santa Clara, CA (US)

(72) Inventors: Chi-Taou Robert Tsai, Chandler, AZ (US); Lillian G. Lent, Chandler, AZ (US); Curtiss D. Roberts, Chandler, AZ (US); Cindy Muir, Tempe, AZ (US)

(73) Assignee: Intel IP Corporation, Santa Clara, CA (US)

( * ) Notice: Subject to any disclaimer, the term of this patent is extended or adjusted under 35 U.S.C. 154(b) by 125 days.

This patent is subject to a terminal disclaimer.

(21) Appl. No.: 16/191,778

(22) Filed: Nov. 15, 2018

(65) Prior Publication Data

US 2019/0088405 A1    Mar. 21, 2019

Related U.S. Application Data (63) Continuation of application No. 15/282,404, filed on Sep. 30, 2016, now Pat. No. 10,199,157.

(51) Int. Cl.
H01F 27/24    (2006.01)
H01F 41/04    (2006.01)
H01F 27/28    (2006.01)

(52) U.S. Cl.
CPC ......... *H01F 27/2847* (2013.01); *H01F 41/04* (2013.01)

(58) Field of Classification Search
CPC .. H01F 27/2847; H01F 27/2804; H01F 41/04; H01F 17/0006; H01F 2017/0046; H01F 2017/0073

USPC ........ 336/200, 223, 222; 29/602.1, 605, 606
See application file for complete search history.

(56) References Cited

U.S. PATENT DOCUMENTS

| 5,844,451 | A | * | 12/1998 | Murphy | ............... H03H 7/0115 333/185 |
| 6,841,847 | B2 | | 1/2005 | Sia et al. | |
| 6,992,366 | B2 | | 1/2006 | Kim et al. | |
| 8,289,118 | B2 | | 10/2012 | Chiu et al. | |
| 2003/0071706 | A1 | * | 4/2003 | Christensen | ........ H01F 27/2804 336/200 |
| 2008/0284553 | A1 | * | 11/2008 | Lim | ...................... H01F 27/006 336/200 |
| 2015/0340149 | A1 | * | 11/2015 | Lee | ......................... H05K 1/165 174/260 |
| 2016/0027571 | A1 | * | 1/2016 | Zhang | ..................... H01F 19/04 336/173 |

(Continued)

OTHER PUBLICATIONS

Search Report dated Oct. 18, 2017 for International Application No. PCT/US2017/050439.

*Primary Examiner* — Mang Tin Bik Lian
(74) *Attorney, Agent, or Firm* — Schiff Hardin LLP (57) ABSTRACT An inductor has a conductor layer formed by multiple concentric co-planar turns of a first metal layer (e.g., ultra-thick metal (UTM)) adapted to receive current at a frequency of at least one gigahertz. The multiple turns of the first metal layer proceed from an innermost turn to an outermost turn, and a stacking layer of a second metal is provided over each of the first metal layer turns except at least the innermost turn, thereby optimizing the Q of the inductor.

20 Claims, 9 Drawing Sheets (56) References Cited

U.S. PATENT DOCUMENTS

2016/0099301 A1 4/2016 Yen et al.
2016/0217904 A1 7/2016 Vanukuru
2018/0096779 A1 4/2018 Tsai et al.

* cited by examiner

STACKED METAL INDUCTOR

CROSS REFERENCE TO RELATED APPLICATIONS

This application is a continuation of U.S. application Ser. No. 15/282,404, filed on Sep. 30, 2016, which is incorporated herein by reference in its entirety.

BACKGROUND

The present disclosure relates generally to inductors of the type having multiple planar windings composed of a layer of ultra-thick metal (UTM) with an aluminum (AL) layer stacked thereon. More particularly, the present disclosure concerns an inductor of this type which has an optimize quality factor (Q), preferably a higher Q.

The present disclosure also concerns a method for making such an inductor.

DETAILED DESCRIPTION

An inductor is one of the fundamental passive components, together with resistors and capacitors that are used in a wide variety of electrical circuits. The classic definition of a conductor is a passive two-terminal component that resists changes in electric current passing through it. An inductor is basically composed of a conductor, such as a wire, that is usually wound into the form of a coil, either as a coil (three-dimensional) or a spiral (planar configuration). Energy is stored in the magnetic field produced in the coil as long as current is flowing through the coil. When current flowing through the coil changes, the time varying magnetic field resulting therefrom induces a voltage in the conductor according to Faraday's law of electromagnetic induction. The relationship between the time-varying voltage v(t) across an inductor having an inductance L, and the time-varying current i(t) passing through the inductor is described by the differential equation:

$$v(t)=L\ di(t)/dt.$$

When the current through the inductor is an alternating (AC) current, the amplitude of the voltage is proportional to the product of the amplitude of the current and the frequency of the current.

Inductors are commonly found in almost all wireless radio-frequency integrated circuits that are currently in use. One example is an inductor that is used in a voltage controlled oscillator (VCO) or digital controlled oscillator (DCO). A DCO or VCO is composed of three basic components, namely an inductor L, a capacitor C, and an active transistor circuit that provides the energy (signal source). The DCO or VCO will oscillate at a frequency F based on the relationship $$f=1/(2\pi\sqrt{LC}).$$

The DCO/VCO precision low noise radio-frequency signals, or clock references, are considered to be the heart of modern wireless integrated circuits. Due to the complexity of today's communication integrated circuits for cell phone applications, there are often multiple VCO/DCOs in a single transceiver integrated circuit, generating various clocks at different frequencies.

One of the most important parameters in designing an inductor is its quality factor, or Q. The Q of an inductor is defined as $(2\pi fL)/R$, where f is the frequency of the current flowing through the inductor, L is the inductance, and R is the resistance at the operating frequency. In general, the higher the Q, the better the inductor, because a high Q translates to lower phase noise for the clock signal generated using the inductor, and a lower current drain due to its lower ohmic loss. Results of simulation of an integrated circuit DCO design operating at four GHz with varying Q by a few percent are shown in the table below:

| % increase inductor metal resistance | Increase in DCO current (μA) |
|---|---|
| 1 | 59 |
| 2 | 118 |
| 3 | 177 |
| 4 | 236 |
| 5 | 295 |

Figure 1:
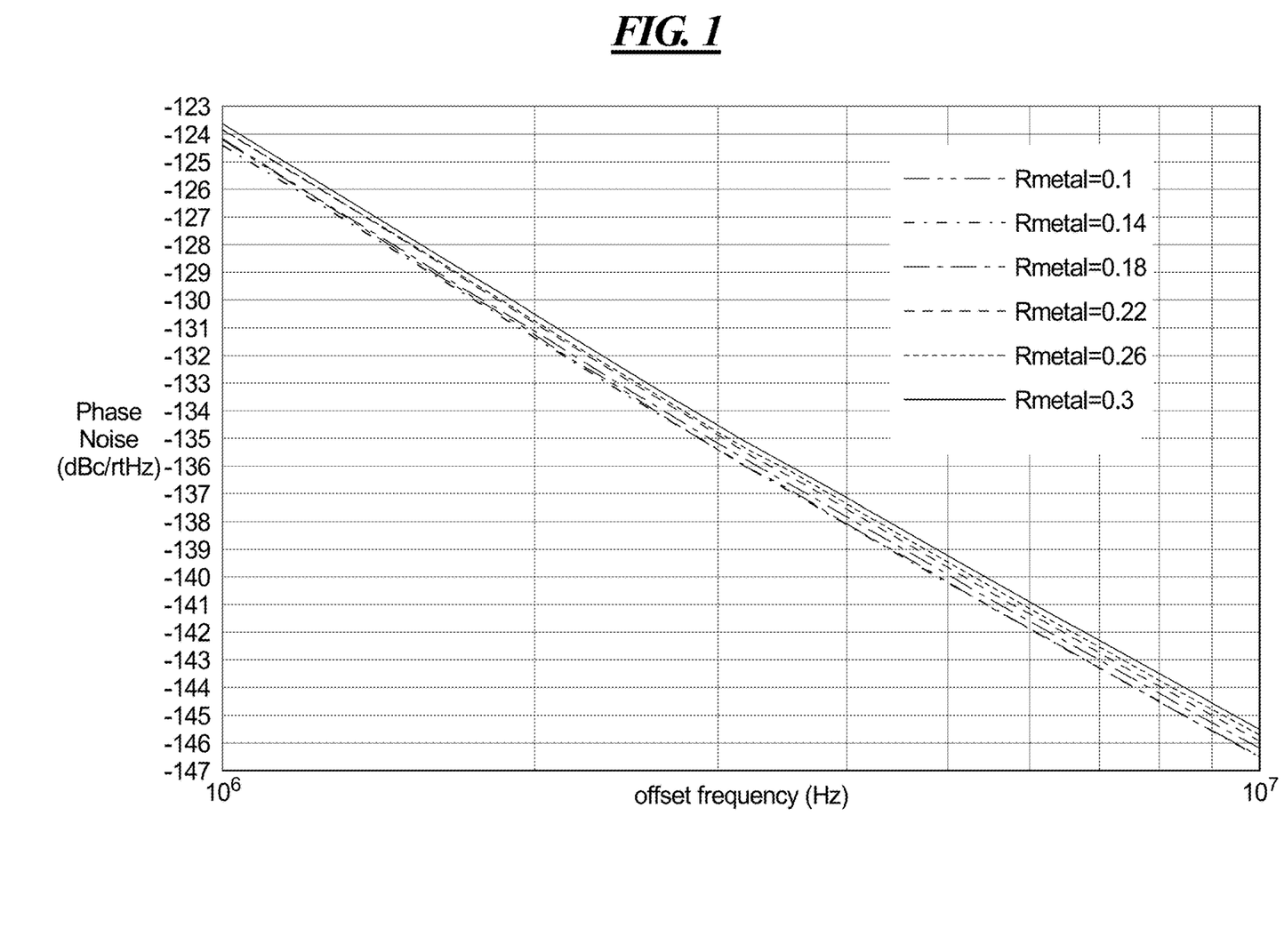
FIG. 1 is a graph showing results of a simulated integrated circuit DCO (Digital Controlled Oscillator) design with varying inductor Q for metallic conductors of different resistances.

FIG. 1 shows a decreasing phase noise for lower inductor metal resistance for the designated different resistances. The impact of inductor Q on current drain or power consumption is more direct because the inductor resistance to energy dissipated at steady state oscillation is:

$$P_{diss}=I_{bias}^2 R_s,$$

wherein $I_{bias}$ is the bias current, and $R_s$ is the inductor's series resistance.

Figure 2:
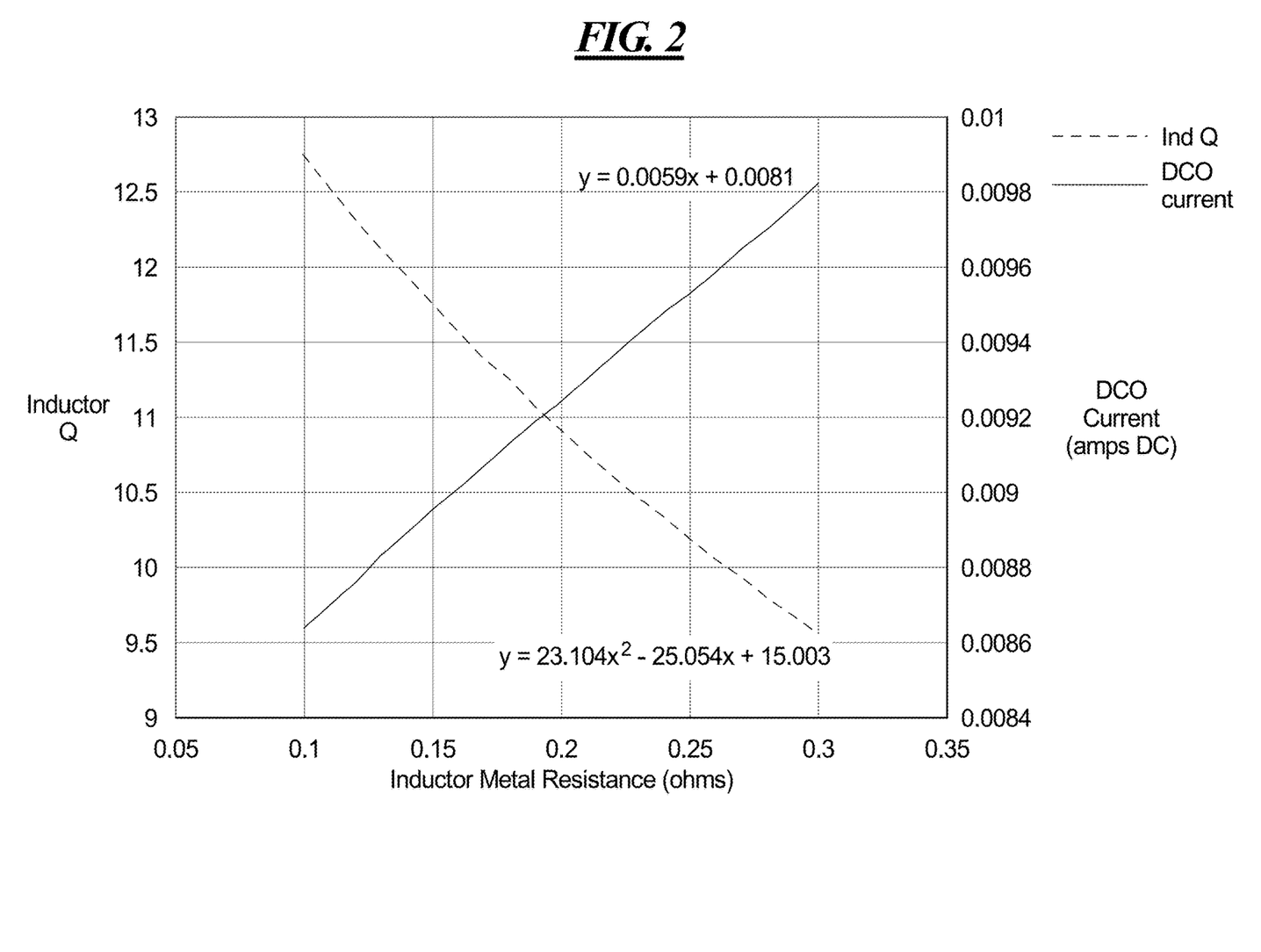
FIG. 2 is a graph showing the relationship between inductor Q and inductor metal resistance in a further simulation.

FIG. 2 is a graph showing the DCO current drain, wherein it can be seen that an almost linear relationship exists with regard to the total DCO resistance, which is the LC tank resistance plus the active device resistance. The calculation of the current change with the changing inductor metal resistance is summarized in the table above, indicating that a 5% increase of inductor resistance corresponds to an increase in current of 295 µA.

Figure 3:
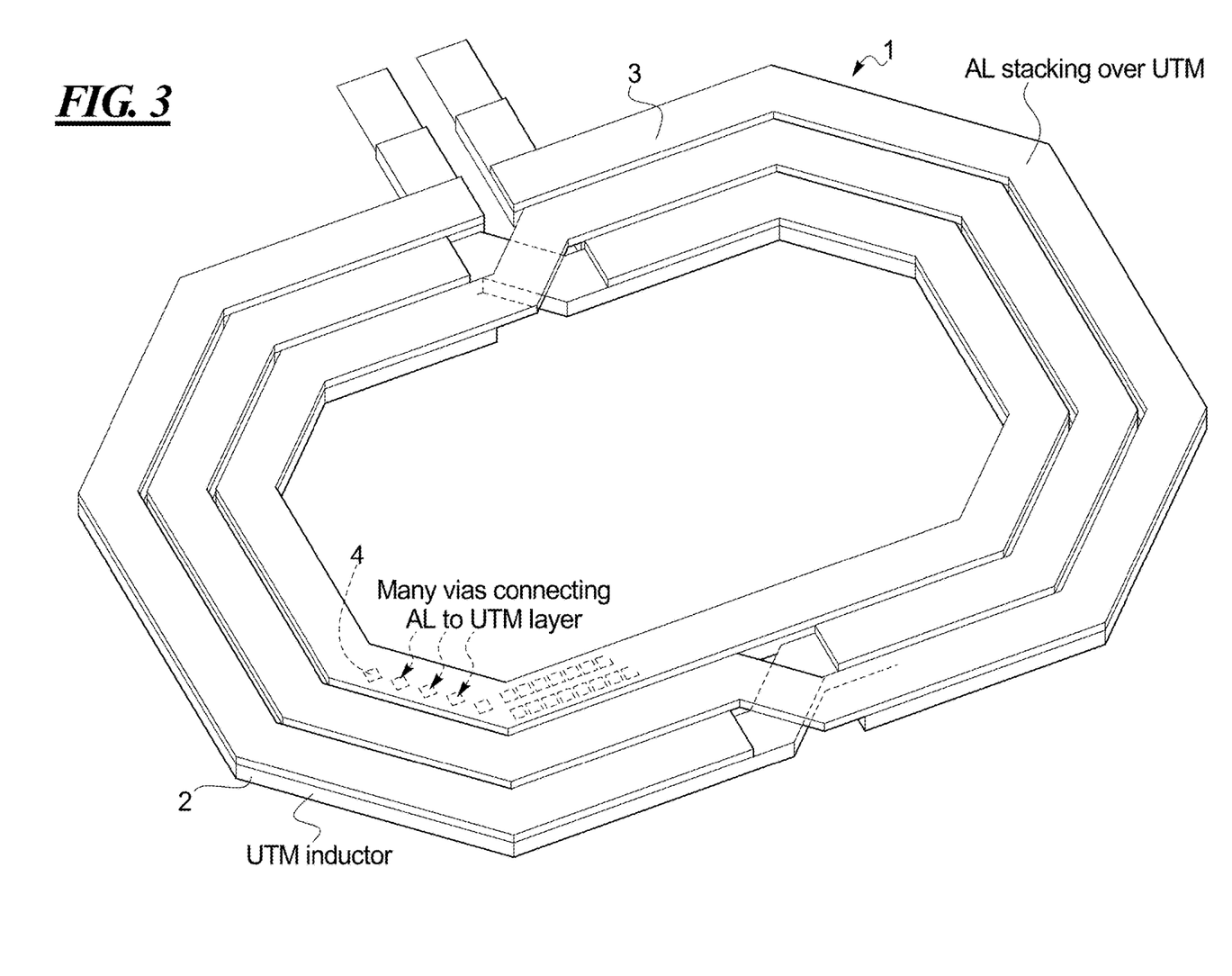
FIG. 3 is a perspective view of a three turn inductor with aluminum (AL) stacking over UTM.

Lower current drain is the most critical factor in today's competitive mobile communication market. Due to the importance of low current drain, significant effort has been given to improving Q of the inductor used in such circuits. A way to obtain such an improvement would be to increase the width of the windings of the inductor. Increasing the width, however, would lower the inductance L, and in order to maintain the same inductance L, the inductor size or area would have to increase substantially in order to compensate, which is a huge penalty. Octagonal or circular shape inductors are often used instead of rectangular inductors in critical designs, due to their slightly higher Q performance. Some approaches make use of a patterned ground shield (PGS) and slotting the inductor windings in order to improve Q. When designing an RF/analog (CMOS) wafer process platform, the primary inductor windings typically reside in the available ultra-thick metal (UTM) layer, usually a copper layer that is used to due to its low sheet resistance. An aluminum layer is then applied above the UTM, or the thinner copper layers below are used for crossovers. In order to further reduce the resistance R of the inductor, one practice is to copy UTM inductor windings to the aluminum layer, and to stack the aluminum layer on top of the UTM, except at the crossovers. The stacked aluminum and UTM layers are then stitched together with an array of vias in an effort to thicken the inductor cross section, thereby lowering its resistance R. Such an integrated inductor 1 composed of UTM windings 2 with an AL layer 3 stacked on top thereof is shown in FIG. 3. For clarity, not every via 4 is shown in FIG. 3. The shown vias 4 exist in every branch of every turn of the inductor in FIG. 3.

An insight on which the present disclosure is based is that at GHz frequencies, or tens of GHz frequencies, where DCO/VCO inductors operate, the high-frequency current flowing in one part of the inductor can be altered by the H field generated from another part of the inductor. This is a known phenomenon called the proximity effect. In the case of an inductor of the type shown in FIG. 3, when the aluminum layer is stacked on the UTM layer, the proximity effect can push more current into the higher-resistive aluminum layer, causing a higher R (and therefore lowering Q) than that of an inductor using only a UTM layer. The present disclosure is based on a study that shows for multi-turn inductors, the inductor's inner turns (windings) suffer more proximity effect than the inductor's outer turns, due to the H field distribution in that type of inductor. The present disclosure is based on the insight of optimizing the Q of a multi-turn inductor by stacking the aluminum layer over the UTM layer on only the outer turns of the inductor, while leaving one or more inner turns uncovered by the aluminum layer, and thus composed of UTM only. This structure is easy to implement, and leads to a significant Q improvement.

The aforementioned solution can be easily generalized in terms of inductor design, so that no elaborate inductor patterns are involved, and the solution can be easily applied to existing inductors with no major re-design and with minimum layout change. The technique in accordance with the present disclosure can be combined with known techniques, such as PGS. The technique in accordance with the present disclosure can be applied to inductors having an octagon shape, slotted inductors, or inductors having the shape of a figure eight for additional Q improvement. The technique can also be used in all known CMOS RF/analog process with different metal stacks. Because the strength of the proximity effect depends on many factors, including the relative thickness of the UTM and aluminum layers (sheet resistance ratio of aluminum to UTM), the optimum point to begin stacking the aluminum layer on the inductor outer turns may be different for various processes, but the principal applies to all wafer processes and all inductor designs.

Figure 4:
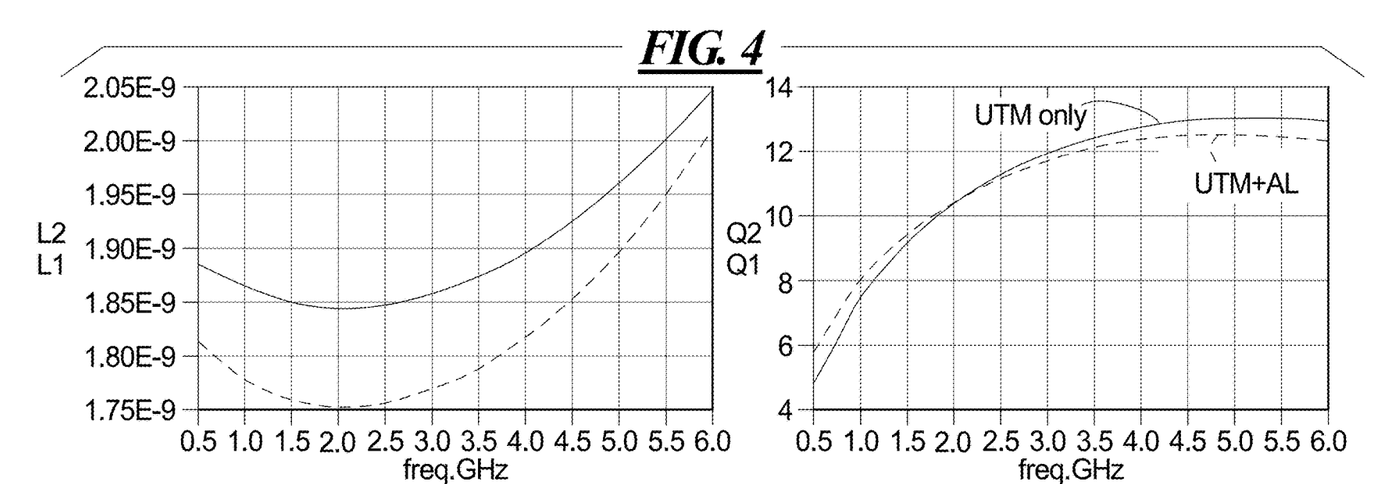
FIG. 4 shows L and Q comparison graphs of two simulated TXDCO8 inductors, one with stacking AL over UTM, and the other with UTM only.
Figure 5:
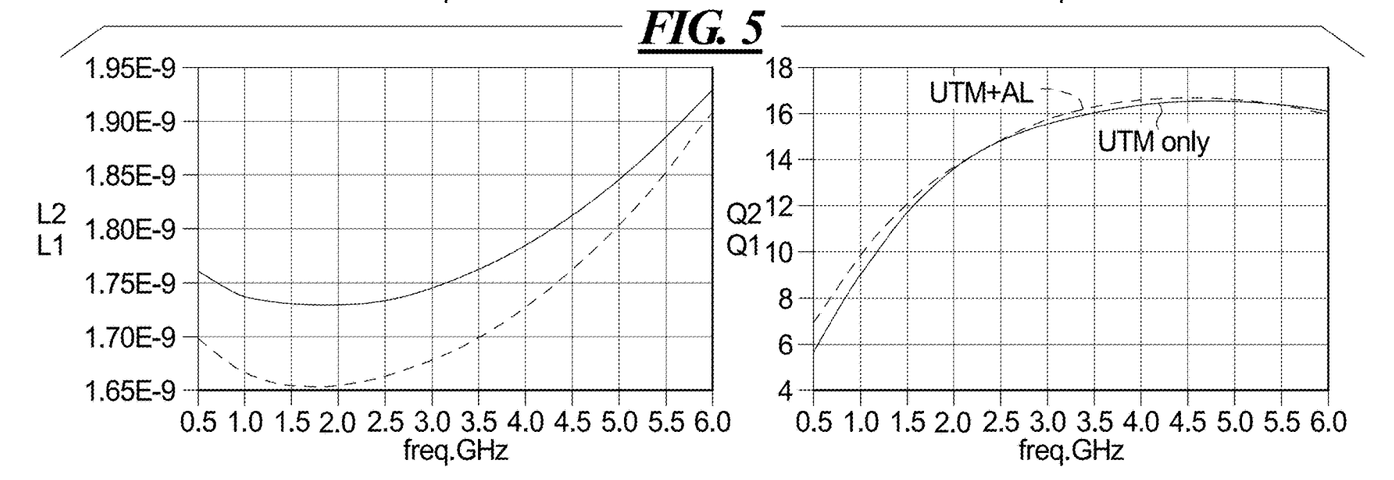
FIG. 5 shows L and Q comparison graphs of two simulated TXDCO3 inductors, one with stacking AL over UTM, and the other with UTM only.

In order to provide a basis for evaluating the Q improvement obtained in accordance with the present disclosure, two inductors (TXDCO3 and TXDCO8) were simulated, in order to characterize their L and Q, comparing the option of using UTM only and the option of using stacked aluminum over UTM. For the four turn TXDCO8, the UTM-only option showed a higher Q than that of the AL+UTM option, as shown in FIG. 4. This can be explained by the proximity effect, in which the current in one winding is affected by the H-field generated by its neighboring windings, and is thereby pushed into the higher resistive aluminum layer, thereby causing a higher effective R (and Q becomes lower), than an inductor without an aluminum layer, at frequencies above 2 GHz. However, for the three-turn TXDCO3, the Q of the UTM-only inductor appears to be approximately the same as that of the UTM+AL inductor, as shown in FIG. 5, indicating that the proximity effect appears to be not large enough to offset the lowering of R with stacking aluminum.

Figure 6:
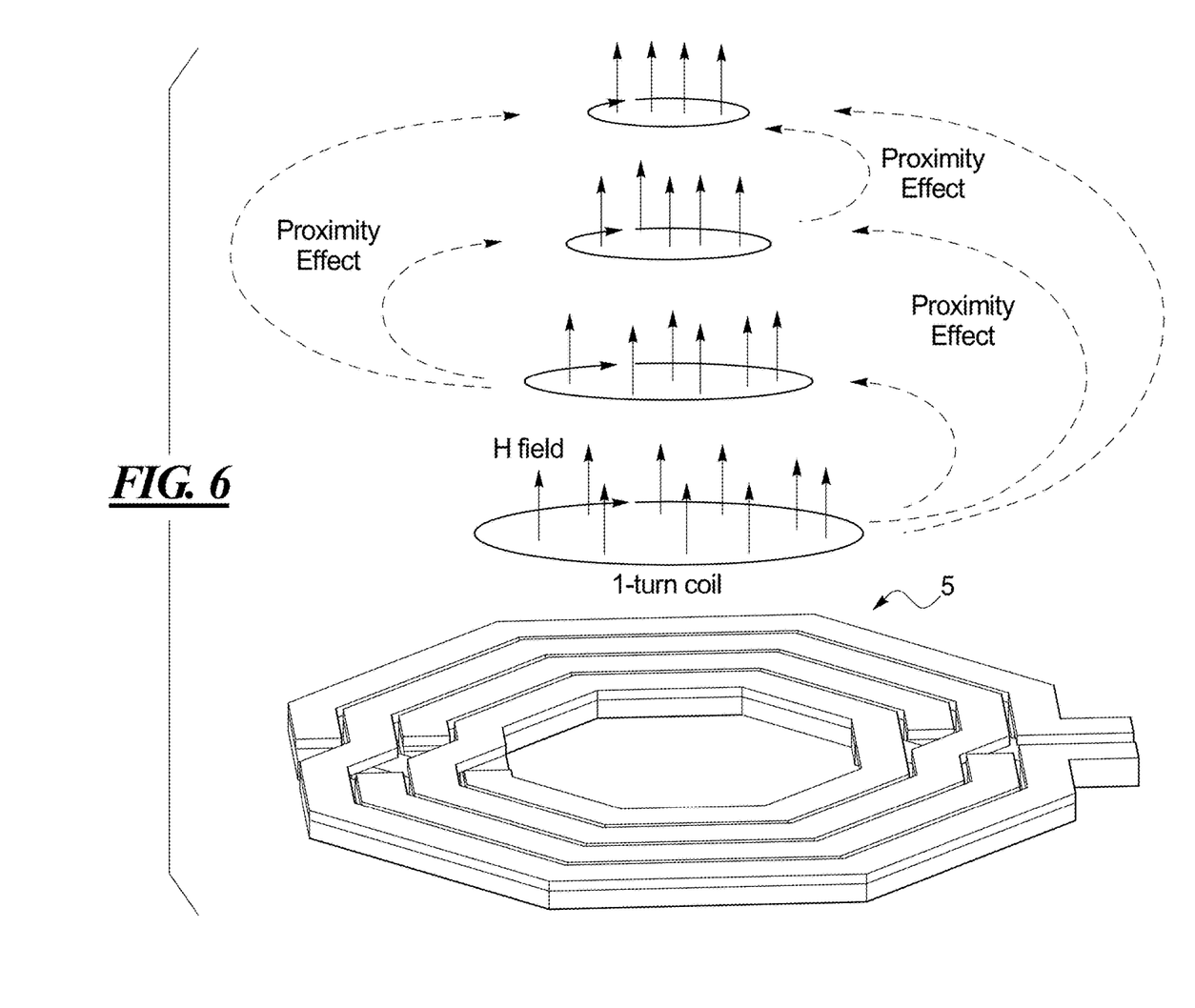
FIG. 6 shows the proximity effect with respect to respective turns of a four turn stacked inductor.

Further studies show that the proximity effect and the inductor R interact in a more complex way, which can be illustrated in the example of a four-turn inductor as follows. The four-turn inductor 5 can be decomposed into four progressively smaller concentric one-turn coils, as shown in FIG. 6. From electromagnetic theory, it is known that each coil generates an H-field from the current in that coil, but the H-field is concentrated only in inside of the coil, and is diminished outside of the coil. This means that the outermost coil does not experience the proximity effect, because the H-field generated by all of the inner coils is contained within the inner coils, and very little of the H-field proceeds through the windings of the outermost coil at a location at which current is flowing therein. The second outermost coil then suffers from the proximity effect only by the H-field of the outermost coil, etc., until the innermost coil is reached. The innermost coil will suffer the most proximity effect, because that coil accumulates H-fields from all of the other outer coils. Consequently, for optimizing the Q of a multi-turn inductor, the inductor in accordance with the present disclosure uses AL+UTM layers on the outer turns, where the proximity effect is weak in order to reduce R, but uses UTM only on the inner turns, in order to avoid the proximity effect.

Figure 7A:
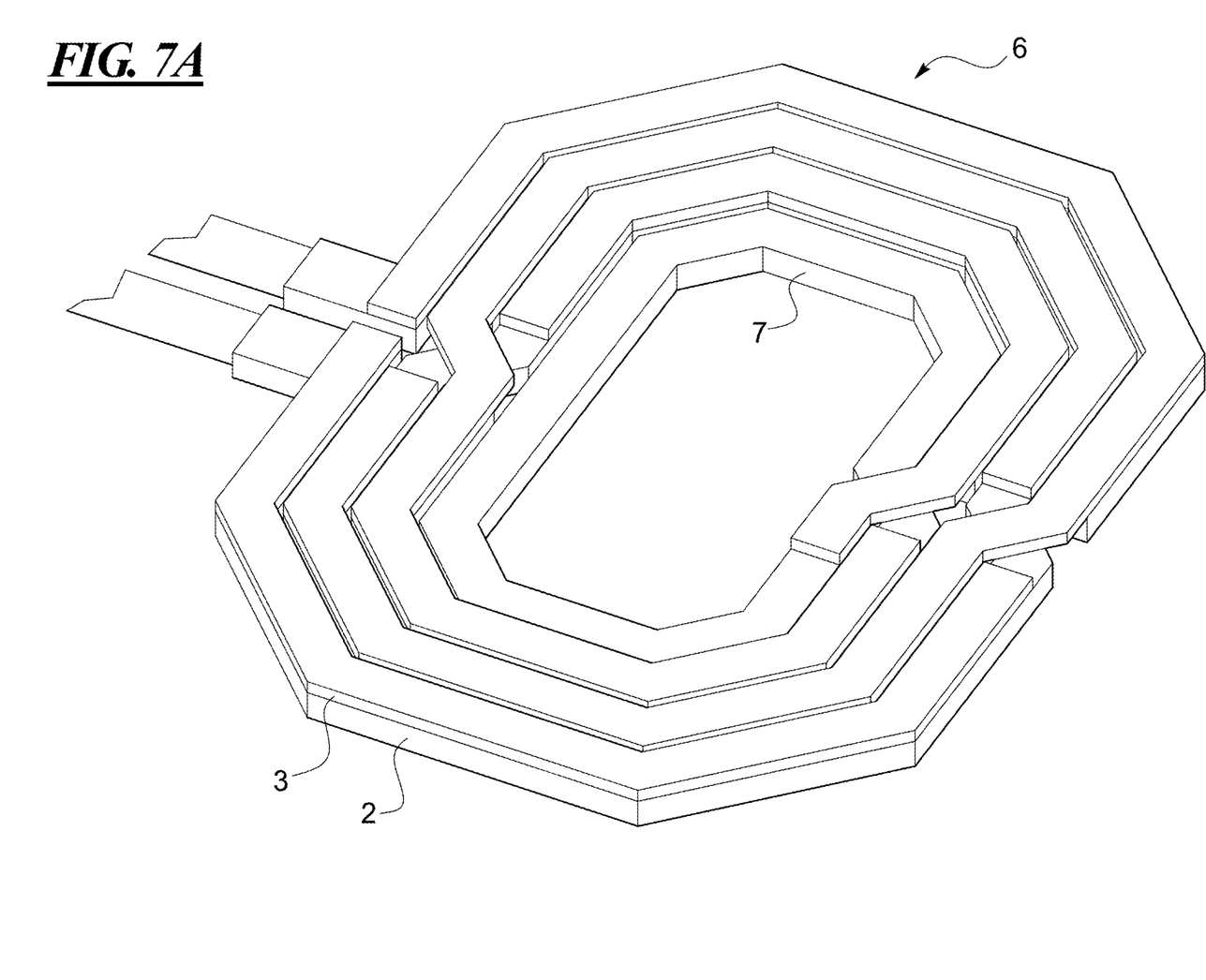
FIG. 7A is a perspective view of a four turn inductor in accordance with one aspect of the disclosure, with no stacked aluminum layer on the innermost turn.
Figure 7B:
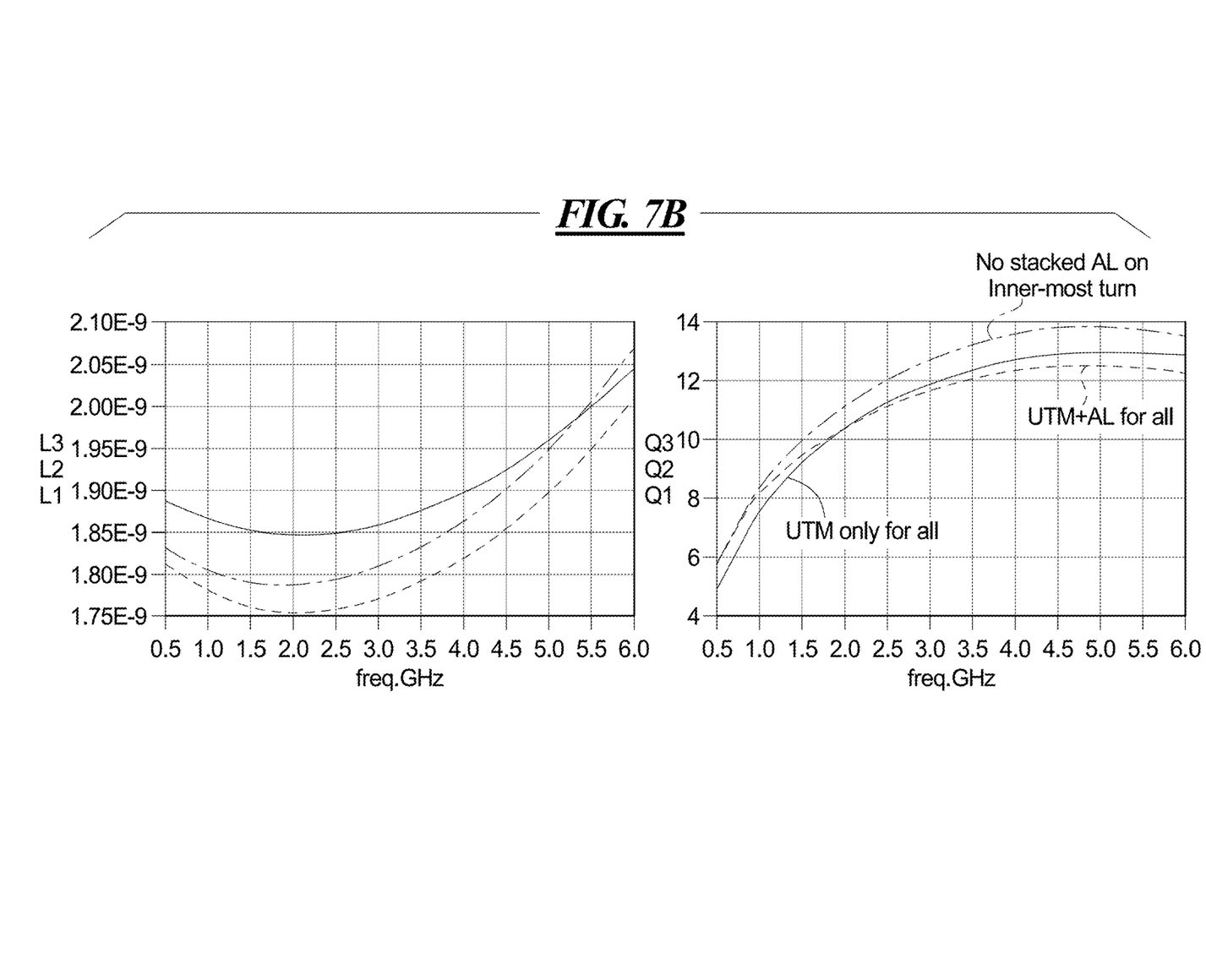
FIG. 7B shows graphs of L and Q comparison of TXDO8 inductors, for UTM only for all turns, UTM with AL stacking for all turns, and UTM with no AL stacking on the innermost turn.

One aspect of the disclosure is shown in FIG. 7A, which is a simulated TXDCO8 inductor 6 with the aluminum layer of the innermost turn 7 removed. The same simulation as described above for the inductor was re-run, which the results being shown in FIG. 7B for comparison of L and Q with the previous AL+UTM and all UTM-only scenarios. For the inductor in accordance with the present disclosure, the Q was improved by approximately 5% over UTM only or AL+UTM.

Figures 8A, 8B:
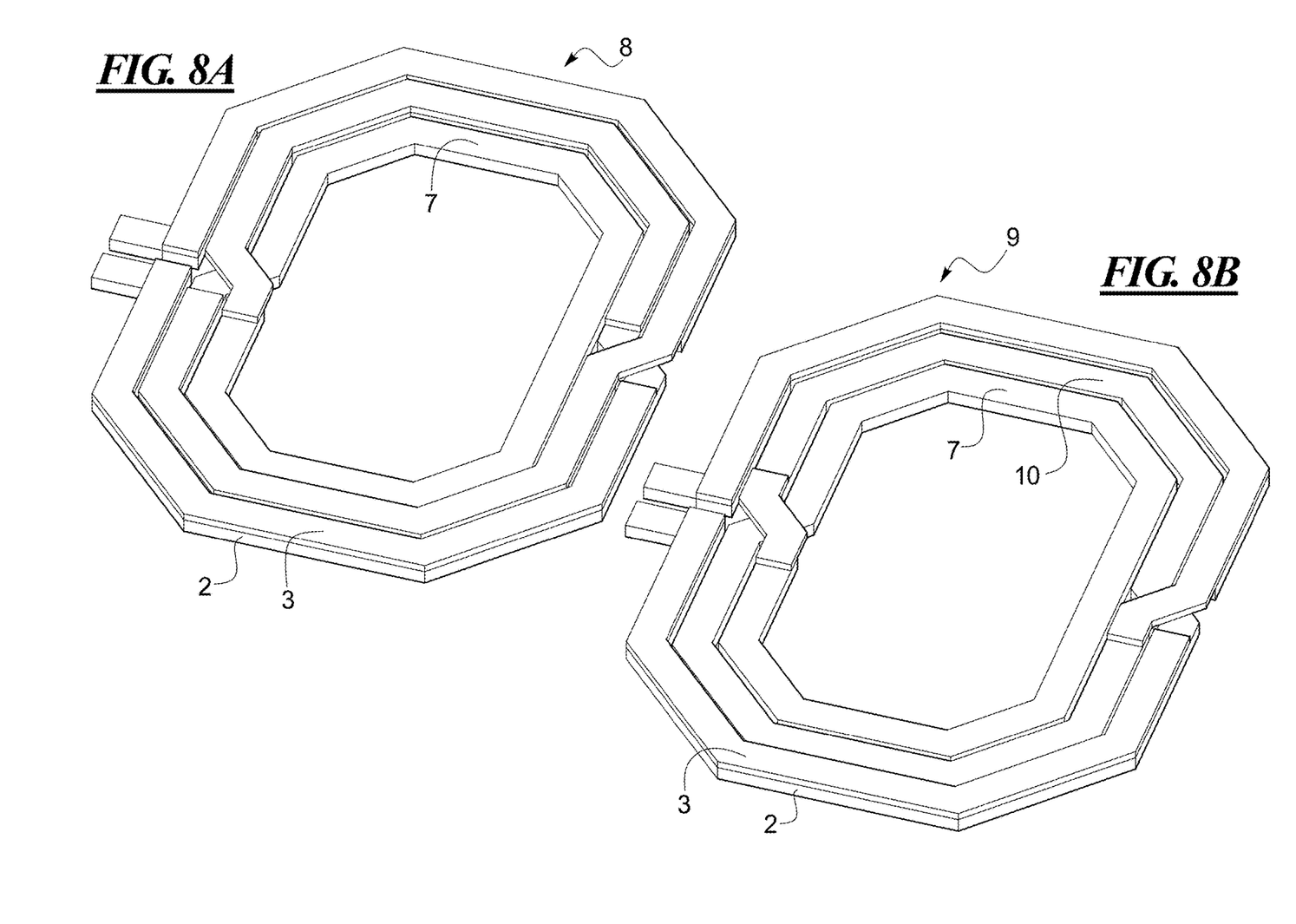
FIG. 8A is a perspective view of three turn inductor in an aspect of the present disclosure, with no stacked AL on the innermost turn.
FIG. 8B is a perspective view of a three turn inductor in accordance with the disclosure, with no stacked AL on the two innermost turns.
Figure 8C:
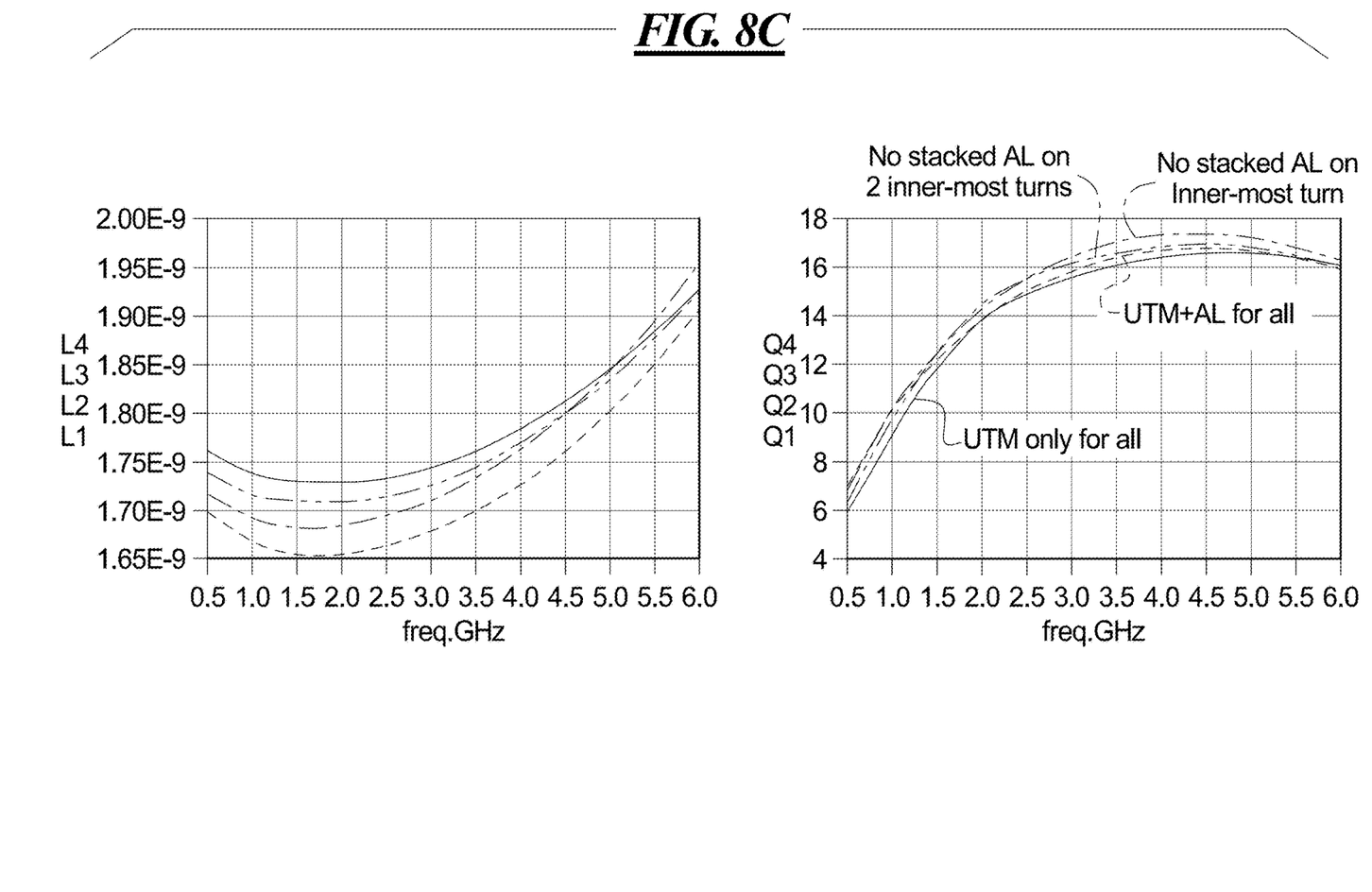
FIG. 8C shows graphs showing L and Q comparisons of TXDCO3 inductors, with UTM only for all turns, UTM with AL stacking for all turns, UTM with no AL stacking on the innermost turn, and UTM with no AL stacking on the two inner turns.

FIG. 8A shows a TXDCO3 inductor 8 in accordance with the disclosure (three-turn inductor 8 as opposed to four-turn inductor 6 shown in FIG. 7A), with the aluminum layer removed from the innermost turn 7. FIG. 8B shows a TXDCO3 inductor 9 in accordance with the present disclosure with the aluminum layer removed from the two inner layers 7 and 10. FIG. 8C shows the simulation results for these aspects of the disclosure. These simulation results show that UTM-only for all turns has the lowest Q and adding stacked AL would improve Q, but the highest Q (approximately 5% better than all UTM-only or all AL+UTM) is achieved by stacking AL on the outer two turns, and removing AL on the innermost turn. Removing the aluminum layer on additional turns begins degrading Q again, and hence an optimum Q exists for multi-turn inductor designs wherein a fixed number of inner turns uses UTM only, and all outer turns use AL+UTM. This number may be one.

The impact of the proximity effect on the inductor Q may depend on factors including the sheet resistance ratio between the aluminum layer and the copper UTM layer (processed dependent), the ratio of inductor width/spacing/turns (design dependent), as well as other factors, but Q can be optimized in accordance with the present disclosure by stacking aluminum over only the outer turns of the inductor, while leaving a single layer of UTM only on the inner turns. To determine the cutoff point of using or not using stacked aluminum for optimum Q, either electromagnetic simulation can be used, or test chips can be easily measured. Stacking or not stacking an aluminum layer on a particular turn can shift the inductance L slightly, but this shift is small (approximately 2%) and can be taken into account in the overall inductor design, absorbed into PVT, or compensated with capacitance. An improvement in Q of 5% in accordance with the inductor design of the present disclosure translates to an estimated 295 µA of current drain saving.

Although the above examples are described in the context of inventors, the described techniques can also be used for improving Q in devices composed of inductors/coils that are wound together, such as baluns or transformers.

Example 1 is an inductor comprising a conductor layer comprising a plurality of concentric co-planar turns of ultra-thick metal (UTM) adapted to receive current at a frequency of at least one gigahertz, said plurality of turns of UTM proceeding from an innermost turn to an outermost turn, and aluminum (AL) stacking over all of said UTM turns except at least said innermost UTM turn.

Example 2 is the inductor of Example 1 comprising aluminum stacking over all of said UMT turns except said innermost UTM turn and a next-to-innermost UTM turn.

Example 3 is the inductor of Example 1 wherein only said outermost UTM turn has aluminum stacking thereon.

Example 4 is the inductor of Example 1 wherein said UTM turns and said aluminum stacking are octagonal in shape.

Example 5 is the inductor of Example 1 wherein said UTM comprises copper.

Example 6 is the inductor of Example 1 consisting of four of said UTM turns, with aluminum stacking over all of said UMT turns except the innermost turn of said four UTM turns.

Example 7 is the inductor of Example 1 consisting of three of said UTM turns, with aluminum stacking over all of said UMT turns except the innermost turn of said three UTM turns.

Example 8 is the inductor of Example 1 consisting of three of said UTM turns, with aluminum stacking over all of said UMT turns except the innermost turn of said three UTM turns and a next-to-innermost turn of said three UTM turns.

Example 9 is a conductor layer comprising at least three concentric co-planar turns of ultra-thick metal (UTM) adapted to receive current at a frequency of at least one gigahertz, said at least three turns of UTM being arranged outwardly from an innermost turn to an outermost turn and aluminum (AL) stacking over all of said UTM turns except said innermost UTM turn and a next-to-innermost UTM turn.

Example 10 is the conductor layer of Example 9 wherein said UTM turns and said aluminum stacking are octagonal in shape.

Example 11 is the conductor layer of Example 9 wherein said UTM comprises copper.

Example 12 is a method for manufacturing an inductor, comprising forming a conductor layer to have a plurality of concentric co-planar turns of ultra-thick metal (UTM) adapted to receive current at a frequency of at least one gigahertz, said plurality of turns of UTM being arranged outwardly from an innermost turn to an outermost turn, and aluminum stacking over all of said UTM turns except at least said innermost UTM turn.

Example 13 is the method of Example 12 further comprising providing aluminum stacking over all of said UMT turns except said innermost UTM turn and a next-to innermost UTM turn.

Example 14 is the method of Example 12 further comprising providing only said outermost UTM turn with aluminum stacking thereon.

Example 15 is the method of Example 12 further comprising forming said UTM turns and said aluminum stacking to be octagonal in shape.

Example 16 is the method of Example 12 further comprising using copper as said UTM.

Example 17 is the method of Example 12 further comprising forming only four of said UTM turns, with aluminum stacking over all of said four UMT turns except the innermost turn of said four UTM turns.

Example 18 is the method of Example 12 further comprising forming only three of said UTM turns, with aluminum stacking over all of said UMT turns except the innermost turn of said three UTM turns.

Example 19 is the method of Example 12 further comprising forming only three of said UTM turns, with aluminum stacking over all of said UMT turns except the innermost of said three UTM turns and a next-to-innermost of said three UTM turns.

Although modifications and changes may be suggested by those skilled in the art, it is the intention of the Applicant to embody within the patent warranted hereon all changes and modification as reasonably and properly come within the scope of the Applicant's contribution to the art.

The invention claimed is:

1. An inductor, comprising:
a conductor layer including a plurality of concentric co-planar turns of a first metal layer adapted to receive current at a frequency of at least one gigahertz, the plurality of concentric co-planar turns of the first metal layer proceeding from an innermost turn to an outermost turn; and
a second metal layer formed directly over and making electrical contact with each of the first metal layer turns except (i) at least the innermost first metal layer turn, and (ii) at one or more crossovers between each of the plurality of turns of the first metal layer,
wherein the second metal layer has a higher resistance than the first metal layer.

2. The inductor of claim 1, wherein the first metal layer comprises an ultra-thick metal (UTM) layer.

3. The inductor as claimed in claim 2, wherein the UTM comprises copper.

4. The inductor as claimed in claim 1, wherein the second metal layer is formed directly over all of the first metal layer turns except for the innermost first metal layer turn and a next-to-innermost first metal layer turn.

5. The inductor as claimed in claim 1, wherein only the outermost first metal layer turn has the second metal layer thereon.

6. The inductor as claimed in claim 1, wherein the plurality of concentric co-planar turns of the first metal layer are octagonal in shape.

7. The inductor as claimed in claim 1, wherein the plurality of concentric co-planar turns is four first metal layer turns, with the second metal layer being over each of the first metal layer turns except the innermost turn of the four first metal layer turns.

8. The inductor as claimed in claim 1, wherein the plurality of concentric co-planar turns is three first metal layer turns, with the second metal layer over each of the first metal layer turns except the innermost turn of the three first metal layer turns.

9. The inductor as claimed in claim 1, wherein the plurality of concentric co-planar turns is three first metal layer turns, with the second metal layer over each of the first metal layer turns except the innermost turn of the three first metal layer turns and a next-to-innermost turn of the three first metal layer turns.

10. An inductor comprising:
a conductor layer comprising at least three concentric co-planar turns of a first metal layer adapted to receive current at a frequency of at least one gigahertz, the at least three turns of the first metal layer proceeding from an innermost turn to an outermost turn; and
a second metal layer formed directly over and making electrical contact with all of the first metal layer turns except (i) the innermost first metal layer turn, (ii) a next-to-innermost first metal layer turn, and (iii) at one or more crossovers between each of the at least three concentric co-planar turns of the first metal layer,
wherein the second metal layer has a higher resistance than the first metal layer.

11. The inductor as claimed in claim 10, wherein the first metal layer turns and the second metal layer turns form an octagonal shape.

12. The inductor as claimed in claim 10, wherein the first metal layer comprises a copper ultra-thick metal (UTM) layer.

13. A method for manufacturing an inductor, comprising:
forming a conductor layer having a plurality of concentric co-planar turns of a first metal layer adapted to receive current at a frequency of at least one gigahertz, the plurality of turns of the first metal layer proceeding from an innermost turn to an outermost turn; and
forming a second metal layer directly over the first metal layer to make electrical contact with each of the first metal layer turns except (i) at least the innermost first metal layer turn, and (ii) at one or more crossovers between each of the plurality of concentric co-planar turns of the first metal layer,
wherein the second metal layer has a higher resistance than the first metal layer.

14. The method as claimed in claim 13, further comprising:
providing the second metal layer over each of the first metal layer turns except the innermost first metal layer turn and a next-to innermost first metal layer turn.

15. The method as claimed in claim 13, further comprising:
providing only the outermost first metal layer turn with the second metal layer thereon.

16. The method as claimed in claim 13, further comprising:
forming the first metal layer turns and the second metal layer turns as an octagonal shape.

17. The method as claimed in claim 13, further comprising:
using a copper ultra-thick metal (UTM) layer as the first metal layer.

18. The method as claimed in claim 13, further comprising:
forming four of the first metal layer turns, with the second metal layer formed over each of the first metal layer turns except the innermost turn of the four first metal layer turns.

19. The method as claimed in claim 13, further comprising:
forming three of the first metal layer turns, with the second metal layer formed over each of the first metal layer turns except the innermost turn of the three first metal layer turns.

20. The method as claimed in claim 13, further comprising:
forming three of the first metal layer turns, with the second metal layer formed over each of the first metal layer turns except the innermost of the three first metal layer turns and a next-to-innermost turn of the three first metal layer turns.

* * * * *